US012633845B2

(12) United States Patent　　(10) Patent No.: US 12,633,845 B2

Glavaski et al.　　(45) Date of Patent: May 19, 2026

(54) VEHICLE DEVICE AND VEHICLE

(71) Applicant: Dr. Ing. h.c. F. Porsche Aktiengesellschaft, Stuttgart (DE)

(72) Inventors: Zeljko Glavaski, Benningen am Neckar (DE); Tomas Lanek, Prague (CZ)

(73) Assignee: Dr. Ing. h.c F. Porsche Aktiengesellschaft, Stuttgart (DE)

( * ) Notice: Subject to any disclaimer, the term of this patent is extended or adjusted under 35 U.S.C. 154(b) by 409 days.

(21) Appl. No.: 18/230,218

(22) Filed: Aug. 4, 2023

(65) Prior Publication Data

US 2024/0048075 A1　　Feb. 8, 2024

(30) Foreign Application Priority Data

Aug. 5, 2022　(DE) ..................... 10 2022 119 683.6

(51) Int. Cl.
| | |
|---|---|
| *H02N 2/18* | (2006.01) |
| *B62D 25/00* | (2006.01) |
| *B62D 29/04* | (2006.01) |
| *H10N 30/00* | (2023.01) |
| *H10N 30/30* | (2023.01) |

(52) U.S. Cl.
CPC ............. *H02N 2/186* (2013.01); *B62D 25/00* (2013.01); *B62D 29/043* (2013.01); *H10N 30/30* (2023.02); *H10N 30/702* (2024.05)

(58) Field of Classification Search
CPC .......... H02N 1/04; H02N 2/186; B62D 25/00; B62D 29/00; B62D 29/043; B62D 39/00; H10N 30/30; H10N 30/702
See application file for complete search history.

(56) References Cited

U.S. PATENT DOCUMENTS

| | | | |
|---|---|---|---|
| 7,429,074 | B2 | 9/2008 | McKnight et al. |
| 7,854,467 | B2 * | 12/2010 | McKnight ............... B64C 23/00 |
| | | | 296/180.1 |
| 8,500,406 | B2 * | 8/2013 | Jimenez ................ F03D 1/0675 |
| | | | 416/240 |
| 10,065,731 | B2 * | 9/2018 | Suntsova ............... H02N 2/186 |
| 10,766,594 | B2 | 9/2020 | Tyler et al. |

(Continued)

FOREIGN PATENT DOCUMENTS

| | | | | |
|---|---|---|---|---|
| DE | 202015103061 | U1 * | 8/2015 | ................ B60J 5/04 |
| DE | 102015222803 | A1 | 5/2017 | |

(Continued)

OTHER PUBLICATIONS

Veriflex—MaterialDistrict; https://materialdistrict.com/material/veriflex/.*

(Continued)

*Primary Examiner* — Adam D Rogers

(74) *Attorney, Agent, or Firm* — Buchanan Ingersoll & Rooney PC

(57) ABSTRACT

A device for a vehicle including a body component and a control device. The body component includes a fiber device having fibers and being electrically connected to the control device. The fibers are formed as conductive, reactive fibers, which fiber device is set up to convert deformation of the body component into electrical energy. The control device is configured to apply a first voltage to at least a portion of the fibers in order to cause a change in the stiffness of the fibers.

17 Claims, 2 Drawing Sheets

(56)        References Cited

U.S. PATENT DOCUMENTS

| | | | | |
|---|---|---|---|---|
| 10,938,328 | B2 * | 3/2021 | Sellinger | F01D 25/005 |
| 11,695,351 | B2 * | 7/2023 | Kim | H02N 1/04 |
| | | | | 310/310 |
| 2009/0066115 | A1 | 3/2009 | Browne et al. | |
| 2010/0032982 | A1 | 2/2010 | Browne et al. | |
| 2016/0312847 | A1 | 10/2016 | Suntsova et al. | |
| 2016/0359429 | A1 * | 12/2016 | Byun | H02N 1/04 |
| 2021/0260858 | A1 | 8/2021 | Wylezinski | |
| 2022/0194487 | A1 | 6/2022 | Sakai et al. | |

FOREIGN PATENT DOCUMENTS

| | | | | | |
|---|---|---|---|---|---|
| DE | 102017223139 | A1 | 6/2019 | | |
| EP | 2830857 | A1 | 2/2015 | | |
| IT | 201900012564 | A1 * | 1/2021 | | H02N 2/186 |
| KR | 20160132225 | A * | 11/2016 | | H04N 1/04 |
| WO | 2007106057 | A2 | 9/2007 | | |
| WO | 2020203091 | A1 | 10/2020 | | |

OTHER PUBLICATIONS

Great Britain Combined Search and Examination Report for Application No. GB2311456.4, dated Jan. 8, 2024, 3 pages.

* cited by examiner

VEHICLE DEVICE AND VEHICLE

CROSS-REFERENCE TO RELATED APPLICATION

This application claims priority to German Patent Application No. 10 2022 119 683.6, filed Aug. 5, 2022, the content of such application being incorporated by reference herein in its entirety.

FIELD OF THE INVENTION

The invention relates to a vehicle device for a vehicle, in particular for a motor vehicle, and to a vehicle having such a vehicle device.

BACKGROUND OF THE INVENTION

U.S. Pat. No. 7,429,074 B1, which is incorporated by reference hererin, shows an airflow control device with an air directing element, which comprises a material with a shape memory.

EP 2 830 857 B1, which is incorporated by reference hererin, shows a composite material for a changeable skin of an aircraft, which material changes its shape as a function of an ambient temperature.

U.S. Pat. No. 10,766,594 B2, which is incorporated by reference hererin, shows a component with an internal support structure and an external wall, wherein the internal support structure is made of a fiber-reinforced plastic and comprises electrical conductors, which serve as a heater and as a strain gauge.

WO 2020/203 091 A1, which is incorporated by reference hererin, shows an outer element for a vehicle, which comprises multiple fiber composite layers.

US 2021/0 260 858 A1, which is incorporated by reference hererin, shows a composite structure for a truck, which comprises a fiber-reinforced polymer and an electrical grid embedded therein with conductive and insulating fibers.

SUMMARY OF THE INVENTION

A vehicle device for a vehicle comprises a body component and a control device, which body component comprises a fiber device, which fiber device comprises fibers and is electrically connected to the control device, which fiber device is set up to convert a deformation of the body component into electrical energy, and which control device is set up to apply a first stress to at least a portion of the fibers in order to effect a change in the stiffness of the fibers. An influence on the fibers can be exerted directly by the energy and their stiffness can be changed, or it can be evaluated in the control unit. The control device can influence the stiffness of the fibers by generating the first voltage, therefore they are reactive. The body component can hereby be stiffened, for example in extreme physical situations. In particular, the torsional stiffness can be increased or decreased as needed. In addition, the fibers lead to an increased stiffness of the body component.

According to a preferred embodiment, the fibers are formed as conductive fibers. They can therefore conduct an electrical current.

According to a preferred embodiment, the fibers are formed as reactive fibers. They can alter their stiffness upon the application of a voltage is applied or upon the flowing of a current, or both.

According to a preferred embodiment, the fiber device is set up to generate the electrical energy by a piezo effect or by a triboelectric effect. These effects can be advantageously exploited to generate electrical energy.

According to a preferred embodiment, the control device is set up to generate a current through at least a portion of the fibers by the first voltage in order to cause the change of the stiffness of the fibers.

According to a preferred embodiment, the control device is set up to receive a first signal which carries first information about a movement of a vehicle, and which control device is set up to influence the first voltage as a function of the first signal. This allows a targeted influence on the stiffness as a function of the current situation.

According to a preferred embodiment, a movement sensor is provided on the body component, which movement sensor is set up to generate and send a second signal to the control device, as a function of a movement of the body component, and which control device is set up to output the first voltage, as a function of the second signal, to preferably reduce movement of the body component. The movement sensor may be a piezoelectric sensor, a position sensor, a potentiometer, a capacitive sensor, an inductive sensor, a transducer, a Hall effect sensor, an encoder, and so forth. As a result, the body component can influence its own stiffness as a function of the second signal and therewith of its own movement. This allows for an immediate, targeted influence on stiffness.

According to a preferred embodiment, the control device is set up to output the first voltage as a function of the second signal to reduce a vibration of the body component. Uncomfortable vibrations of the vehicle can hereby be reduced.

According to a preferred embodiment, the fiber device is set up to output a third signal to the control device as a function of the generated energy, and the control device is set up to generate the first voltage as a function of the third signal. The control device can thus evaluate the deformation of the fibers of the fiber device based on the third signal, and react accordingly by outputting the first voltage. In a simple embodiment, the third signal can be amplified and the amplified signal can be output as the first voltage. For example, the change of the third signal can also be considered.

According to a preferred embodiment, the control device is associated with a data memory, which data memory has stored at least a first data value, which first data value comprises information about a vibrational behavior of the body component, and the control device is set up to output the first voltage as a function of the first data value. The control device can hereby act more specifically against vibrations, for example by changing the first voltage when certain frequencies occur. The control device may comprise a computer having a memory, software instructions loaded in the memory, and a computer processor/controller.

According to a preferred embodiment, the fibers are attached to the body component by at least one connection element from the connection element group consisting of:

lamination, adhesion, and foliation.

These connection elements, together with the body components and the fibers, provide a structure, by which an effective influence on the stiffness is possible.

According to a preferred embodiment, the body components are set up to form an outer skin of a vehicle. In this area, the movements and vibrations created by the wind of travel can be advantageously used to generate electrical energy. Alternatively or cumulatively, the body components can be provided on inner wall panels and/or on structural elements.

According to a preferred embodiment, the fibers comprise piezoelectric material, which piezoelectric material enables a voltage generation as a function of deformation and a change of the stiffness as a function of a current. It is also possible to use only one of these effects and realize the other effect by a different material. Such a material is used, for example, by the HEAD Company for tennis rackets, wherein the HEAD Company uses the "intellifiber" brand for the material.

According to a preferred embodiment, the piezoelectric material is attached by lamination and/or adhesives. Attachment to metals is also possible.

According to a preferred embodiment, the fibers comprise at least one type of fiber from the fiber type group consisting of
   carbon fibers,
   fiberglass,
   plastic fibers.

These fibers advantageously enable an influence to be exerted on the stiffness of the fiber assembly.

According to a preferred embodiment, the body component comprises at least one body component comprised of a group of body components that consists of:
   front hood,
   doors,
   side panels,
   tailgate,
   trunk,
   trunk lid,
   battery housing,
   underbody protection structure,
   housing of the charging device,
   sill area,
   roof,
   vehicle floor, and
   crossbeams.

By employing the vehicle device in one or more of these body components, the noise behavior of the vehicle can be improved.

A vehicle comprises such a vehicle device. The vehicle can thus be caused to vibrate significantly less strongly, in particular at higher speeds, and can be made stiffer when required.

According to a preferred embodiment, the body component has a predetermined position in the vehicle, and the fibers of the fiber device run upwards obliquely at least partially and at least in sections. Tests have shown that such an angled upward path can advantageously influence the stiffness, and in particular the torsional stiffness.

According to a preferred embodiment, the fibers run upwards obliquely at least partially and at least in sections at a first angle from a horizontal 54, which first angle is within the range of 20° to 70°, preferably within the range of 30° to 60°, and particularly preferably within the range of 40° to 50°. These angles allow for an advantageous influence on stiffness.

BRIEF DESCRIPTION OF THE DRAWINGS

Further details and advantageous further developments of the invention emerge from the embodiment examples described below and illustrated in the drawings and in no way to be understood as limiting the invention, and from the subclaims. It is understood that the features mentioned above and those yet to be discussed below can be used not only in the respectively specified combination, but also in other combinations or on their own, without leaving the scope of the present invention. The following are shown.

DETAILED DESCRIPTION OF THE INVENTION

Parts that are the same or have the same effect are provided with the same reference numbers in the following and are usually described only once. The descriptions of all of the FIGS. build on one another in order to avoid unnecessary repetitions.

Figure 1:
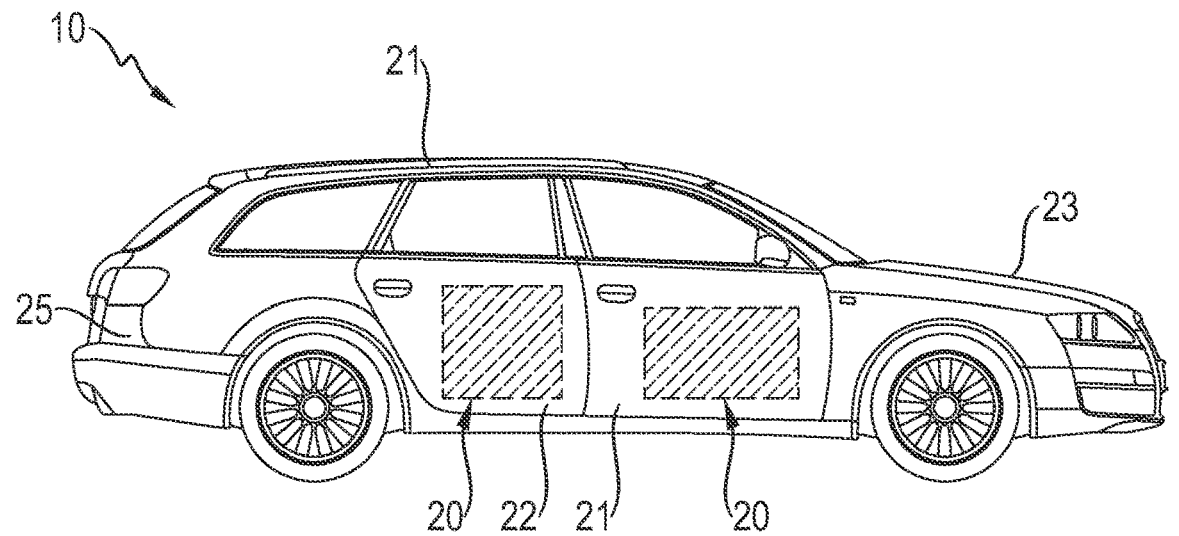
FIG. 1 is a schematic side view, a vehicle.

FIG. 1 shows a vehicle 10 with body panels 21-25. These are, for example, a front door 21, a rear door 22, a front hood 23, a roof 24, and a bumper or apron 25.

In the embodiment example, the front door 21 and the rear door 22 each include a vehicle device 20.

Figure 2:
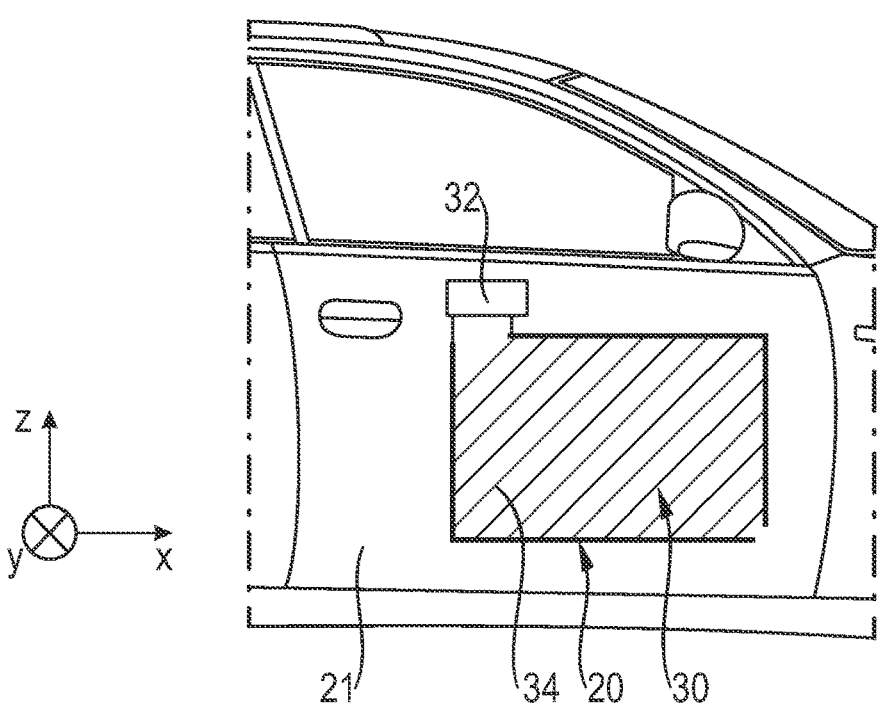
FIG. 2 is a schematic side view, a door of the vehicle of FIG. 1.

FIG. 2 shows the area of the front door 21 with the vehicle device 20 in detail. The vehicle device 20 has a fiber device 30 with fibers 34. The fibers 34 are preferably conductive, reactive fibers. The fibers 34 are, for example, carbon fibers, carbon fiber composites, glass fibers, or glass fiber composites, particularly in electrically conductive designs. The fiber device 30 is connected to a control device 32. For example, the control device 32 can be provided directly within the front door 21, or it can be provided centrally at another location of the vehicle 10.

Furthermore, a vehicle coordinate system that is fixedly installed in the vehicle is plotted with the x-axis pointing forward, the z-axis pointing upward, and the y-axis pointing to the left.

Figure 3:
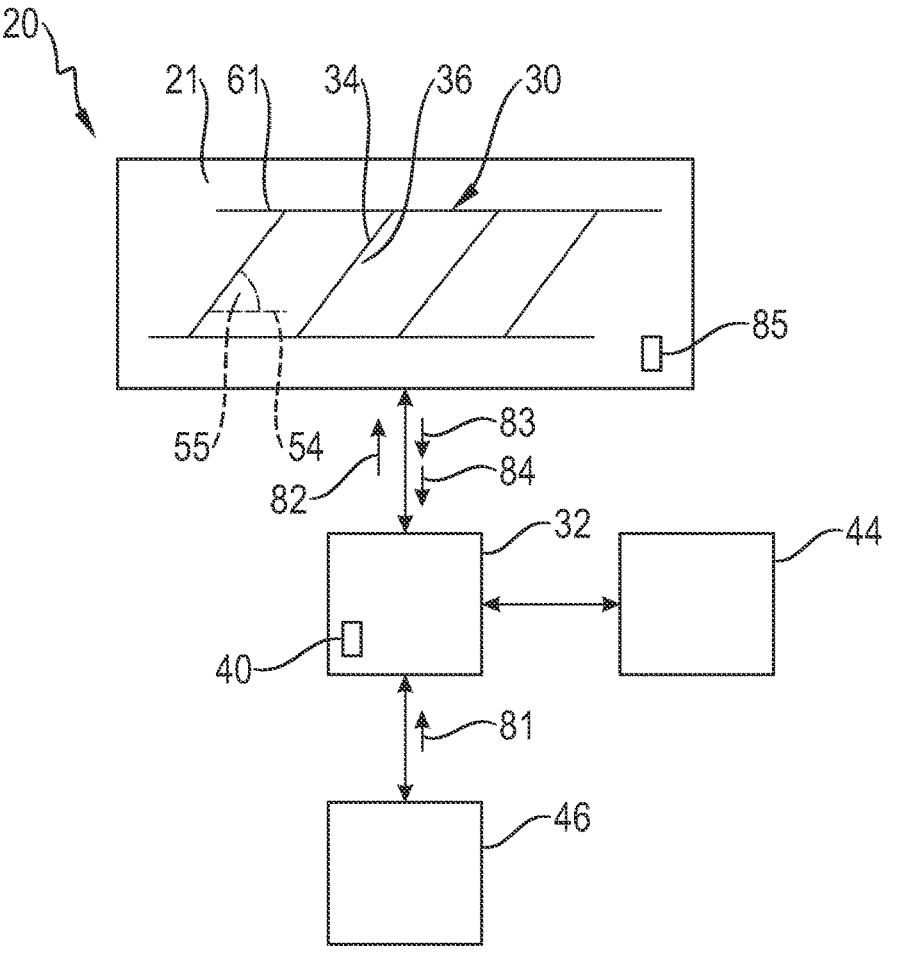
FIG. 3 is a schematic view, a vehicle device of the vehicle of FIG. 1.

FIG. 3 shows the construction of vehicle device 20 in a schematic representation. The fiber device 30 is connected to the control device 32. The control device 32 is connected to an energy storage device 44 and to a data input device 46. The fiber device 30 comprises the fibers 34, and these are connected to the collecting lines 61 in the embodiment example. Furthermore, the fiber device 30 comprises an energy generating device 36, which is set up to generate electrical energy upon deformation of the body component 21 and preferably to supply this energy to the control device 32. For example, the control device 32 can store the electrical energy in an energy storage device 44 by making an electrical connection between the fiber device 30 and the energy storage device 44, for example by a switch or by a diode, or it can evaluate the electrical energy from the energy storage device 44 to generate a voltage at the fiber device 30. The electrical energy can also be used directly to influence the stiffness of the fibers.

The energy generating device 36 is preferably set up to generate the electrical energy by a piezo effect or by a triboelectric effect.

For example, the piezo effect can be achieved by using a piezoelectric polymer or another piezoelectric material.

The triboelectric effect enables two bodies to be charged against each other in the event of friction between them.

Electrical energy can also be generated by a capacitor assembly in case of which a voltage is increased or decreased by a changing distance between two capacitor plates. For example, the two capacitor plates can be provided at or formed by two spaced-apart areas of the front door 21, or generally of the body components 21 to 25. As a function of the electrical energy, a signal 83 can be generated, which is indicated by an arrow. Kinematic energy, which for example arises by an influencing of the body part 21 to 25 by the wind of travel or by a bumpiness of the subsurface, can be converted to electrical energy by the energy generating device 36. The energy generating device 36 is preferably realized by forming the fibers 34 from a piezoelectric material.

The control device 32 is set up to enable a stress (e.g., voltage 82) to be applied to the fibers 34 in order hereby to cause a change in the stiffness of the fibers 34. The voltage 82 can be applied to the collecting lines 61, for example. For example, the change in the stiffness of the fibers 34 can be influenced by a current and the heat generated thereby, wherein the current is influenced by the voltage 82, or electromechanical effects of the fibers 34 can be exploited. The use of fibers which comprise a piezoelectric material is particularly advantageous. For example, by influencing the stiffness, the transverse stiffness of the vehicle 10 can be influenced as a function of road quality and/or speed.

Preferably, the voltage 82 is generated as a function of the signal 83, for example by amplifying it or by evaluating its time change.

The data input device 46 enables the receipt of sensor data and they are transmitted to the control device 32 as a signal 81. The signal 81 carries first information about a movement of vehicle 10, and the control device 32 is set up to influence the voltage 82 as a function of the first signal 81. Hereby information about the impending movement of the vehicle 10 can be taken into account. For example, a bumpiness can be determined by a vehicle sensor in the front portion of the vehicle 10, and the control device 32 can respond correspondingly by outputting the voltage 82, and influence the stiffness of the fibers 34 and therewith also of the body components 21-25. The signal 81 is preferably obtained from a camera or a vehicle radar device.

Preferably, the body component 21 has a movement sensor 85, which is set up to generate and send a signal 84 to the control device 32, as a function of a movement of the body component 21. Control device 32 is set up to output the voltage 82 as a function of the signal 84, for example in order to reduce movement of the body component 21 during cornering or when driving over potholes, or to reduce a strong vibration of the body component 21.

The vehicle device 20 has a data memory 40 which has stored at least a first data value. The first data value comprises information about a vibration behavior of the body component 21, and the control device 32 is set up to output the first voltage 82 as a function of the first data value. This enables an improved influence on the fiber device 30 by the control device 32, and movements and/or vibrations of the body component 21 can be reduced well.

Preferably, the fibers 34 of the fiber device 30 run upwards obliquely at least partially and at least in sections. Hereby the fibers 34 preferably run upwards obliquely at least partially and at least in sections at an angle 55 from a horizontal, which angle 55 lies within the range of 20° to 70°, preferably within the range of 30° to 60° and particularly preferably within the range of 40° to 50°. A particularly preferred angle 55 amounts to 45°.

Figure 4:
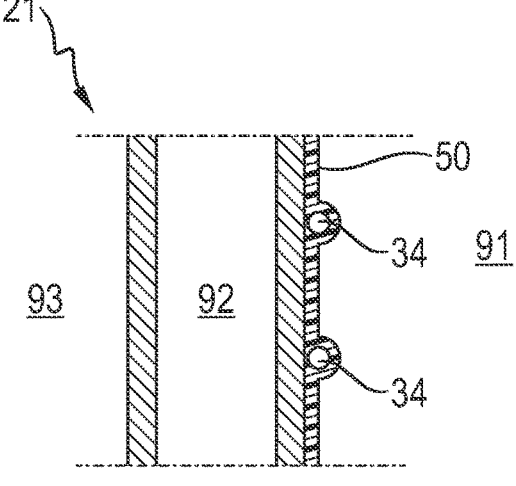
FIG. 4 is a cross-sectional view, a vehicle door having a fiber device.

FIG. 4 schematically illustrates the body component 21, and the fibers 34 are provided on the exterior 91 of the body component 21. Preferably, at least one connecting element

50 is provided from the connecting element group to fasten the fibers 34, this connecting element consisting of:

lamination, adhesion, and foliation.

The fibers 34 can be well secured to the body component 21 by these connecting elements, and the good attachment increases the stiffening effect by the fibers 34. The fibers 34 can also be provided on the inner side 93 of the body component 21 or on a body component 21 having a structure in the inner region 92 of the body component 21.

Many variants and modifications are of course possible within the scope of the present invention.

What is claimed is:

1. A vehicle device for a vehicle, said vehicle device comprising:

a body component and a control device, wherein the body component comprises a fiber device, wherein the fiber device comprises fibers and is electrically connected to the control device, wherein the fiber device is configured to convert a deformation of the body component into electrical energy, and wherein the control device is configured to apply a first voltage to at least a portion of the fibers in order to effect a change in a stiffness of the fibers, wherein the fibers of the fiber device run upwards and obliquely along the body component and the fiber device.

2. The vehicle device according to claim 1, wherein the fiber device is configured to generate the electrical energy by a piezo effect or by a triboelectric effect.

3. The vehicle device according to claim 1, wherein the control device is configured to generate, by the first voltage, a current through the fibers in order to cause the change of the stiffness of the fibers.

4. The vehicle device according to claim 1, wherein the control device is configured to receive a first signal, wherein the first signal carries a first information about a movement of the vehicle, and wherein the control device is configured to influence the first voltage as a function of the first signal.

5. The vehicle device according to claim 1, further comprising a data memory associated with the control device, wherein the data memory has stored at least a first data value comprising information about a vibration behavior of the body component, and wherein the control device is configured to output the first voltage as a function of the first data value.

6. The vehicle device according to claim 1, wherein the fibers are attached to the body component by at least one connection element from a connection element group consisting of:

lamination, adhesion, and foliation.

7. The vehicle device according to claim 1, wherein the body component is configured to form an outer skin of the vehicle.

8. The vehicle device according to claim 1, wherein the fibers comprise piezoelectric material, wherein the piezoelectric material enables voltage generation as a function of the deformation of the body component and a change in the stiffness as a function of a current.

9. The vehicle device according to claim 1, wherein the fibers comprise at least one type of fiber from a fiber type group consisting of:

carbon fibers, fiberglass, and plastic fibers.

10. A vehicle comprising the vehicle device according to claim 1.

11. The vehicle according to claim 10, wherein the body component has a predetermined position in the vehicle.

12. The vehicle device according to claim 1, wherein the fibers run upwards and obliquely along the body component and the fiber device at a first angle from a horizontal, wherein the first angle is within a range of 20° to 70°.

13. The vehicle device according to claim 1, wherein the fibers run upwards and obliquely along the body component and the fiber device at a first angle from a horizontal, wherein the first angle is within a range of 30° to 60°.

14. The vehicle device according to claim 1, wherein the fibers run upwards and obliquely along the body component and the fiber device at a first angle from a horizontal, wherein the first angle is within a range of 40° to 50°.

15. A vehicle device for a vehicle, said vehicle device comprising:

a body component, a control device and a movement sensor disposed on the body component, wherein the body component comprises a fiber device, wherein the fiber device comprises fibers and is electrically connected to the control device, wherein the fiber device is configured to convert a deformation of the body component into electrical energy, wherein the control device is configured to apply a first voltage to at least a portion of the fibers in order to effect a change in a stiffness of the fibers, wherein the control device is configured to receive a first signal, wherein the first signal carries a first information about a movement of the vehicle, wherein the control device is configured to influence the first voltage as a function of the first signal, wherein the movement sensor is configured to generate a second signal as a function of a movement of the body component and transmit the second signal to the control device, and wherein the control device is configured to output the first voltage as a function of the second signal in order to reduce the movement of the body component.

16. The vehicle device according to claim 15, wherein the control device is configured to output the first voltage as a function of the second signal in order to reduce a vibration of the body component.

17. The vehicle device according to claim 15, wherein the fiber device is configured to output a third signal to the control device as a function of the generated energy, and wherein the control device is configured to generate the first voltage as a function of the third signal.

\* \* \* \* \*